(12) United States Patent
Chen

(10) Patent No.: US 8,969,191 B2
(45) Date of Patent: Mar. 3, 2015

(54) MECHANISMS FOR FORMING PACKAGE STRUCTURE

(71) Applicant: Taiwan Semiconductor Manufacturing Co., Ltd., Hsin-Chu (TW)

(72) Inventor: Hsien-Wei Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/943,284

(22) Filed: Jul. 16, 2013

(65) Prior Publication Data
US 2015/0021759 A1    Jan. 22, 2015

(51) Int. Cl.
*H01L 21/44* (2006.01)
*H01L 23/498* (2006.01)
*H01L 23/00* (2006.01)

(52) U.S. Cl.
CPC .......... *H01L 23/49811* (2013.01); *H01L 24/11* (2013.01)
USPC ....................................... 438/613

(58) Field of Classification Search
CPC .............. H01L 21/603; H01L 21/4853; H01L 2924/014
USPC ................................................... 438/612–613
See application file for complete search history.

(56) References Cited

U.S. PATENT DOCUMENTS

| 5,642,261 A | 6/1997 | Bond et al. |
| 6,824,041 B2 | 11/2004 | Grieder et al. |
| 7,514,788 B2 * | 4/2009 | Kobae et al. ........... 257/738 |

* cited by examiner

*Primary Examiner* — Tran Tran
(74) *Attorney, Agent, or Firm* — Birch, Stewart, Kolasch & Birch, LLP

(57) ABSTRACT

Embodiments of mechanisms for forming a package structure are provided. A method for forming a package structure includes providing a semiconductor die and forming a first bump structure and a second bump structure over the semiconductor die. The second bump structure is thinner and wider than the first bump structure. The method also includes providing a substrate having a first contact pad and a second contact pad formed on the substrate. The method further includes forming a first solder paste structure and a second solder paste structure over the first contact pad and the second contact pad, respectively. The second solder paste structure is thicker than the first solder paste structure. In addition, the method includes reflowing the first bump structure and the second bump structure with the first solder paste structure and the second solder paste structure, respectively, to bond the semiconductor die to the substrate.

20 Claims, 10 Drawing Sheets

MECHANISMS FOR FORMING PACKAGE STRUCTURE

BACKGROUND

Semiconductor devices are used in a variety of electronic applications, such as personal computers, cell phones, digital cameras, or other electronic equipment. The semiconductor devices are typically fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller package that utilizes less area or smaller heights, in some applications.

New packaging technologies have been developed to improve the density and functions of semiconductor devices. These relatively new types of packaging technologies for semiconductor devices face manufacturing challenges.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Throughout the various views and illustrative embodiments, like reference numbers are used to designate like elements.

Figure 1A:
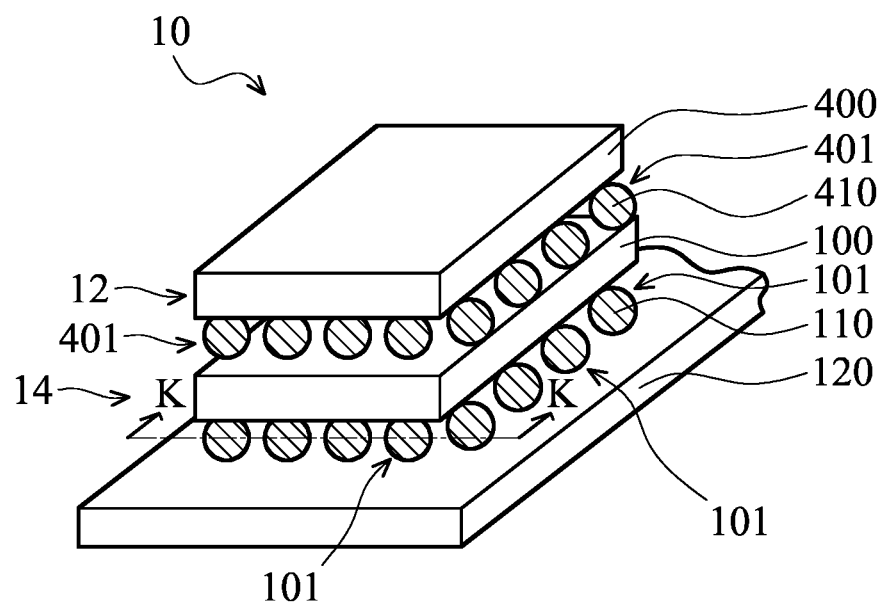
FIG. 1A is a perspective view of a package structure, in accordance with some embodiments.

FIG. 1A shows a perspective view of a package structure 10 having a die package 12 bonded to another die package 14, which is further bonded to a substrate 120, in accordance with some embodiments. Die package 12 includes a semiconductor die 400, and die package 14 includes a semiconductor die 100. Integrated circuits (ICs) are formed in and/or on semiconductor dies 100 and 400.

Each of the semiconductor dies 100 and 400 is defined to mean any construction including semiconductor materials. Each of the semiconductor dies 100 and 400 includes a bulk silicon substrate, a semiconductor wafer, a silicon-on-insulator (SOI) substrate, or a silicon germanium substrate. Other semiconductor materials including group III, group IV, and group V elements may also be used. Each of the semiconductor dies may further include isolation features (not shown), such as shallow trench isolation (STI) features or local oxidation of silicon (LOCOS) features. The isolation features may define and isolate various device elements.

Examples of the various device elements, that may be formed in semiconductor dies 100 and 400, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, other applicable elements, or combinations thereof.

In some embodiments, substrate 120 is a multiple-layer circuit board. In some embodiments, substrate 120 also includes bismaleimide triazine (BT) resin, FR-4 (a composite material composed of woven fiberglass cloth with an epoxy resin binder that is flame resistant), ceramic, glass, plastic, tape, film, or other supporting materials, that may carry conductive pads or lands needed to receive conductive terminals.

In addition, substrate 120 may be made of other materials. Substrate 120 may be made of a semiconductor wafer, or a portion of wafer. In some embodiments, substrate 120 includes silicon, gallium arsenide, silicon on insulator ("SOI") or other similar materials. In some embodiments, substrate 120 also includes passive devices, such as resistors, capacitors, inductors and the like, or active devices, such as transistors. In some embodiments, substrate 120 includes additional integrated circuits. Substrate 120 may further include through substrate vias (TSVs) and may be an interposer.

Die package 12 is bonded to die package 14 via bonding structures 401 including solder bumps 410, contact pads (not shown) and under bump metallurgy structures (not shown). Die package 14 is bonded to substrate 120 via bonding structures 101 including solder bumps 110, contact pads (not shown) and under bump metallurgy structures (not shown). There is a CTE (coefficient of thermal expansion) mismatch between different semiconductor dies 400 and 100, substrates 120, and materials. Therefore, stress is generated on, for example, solder bumps 110 and 410 after performing thermal cycling for forming the package structure.

Figure 1B:
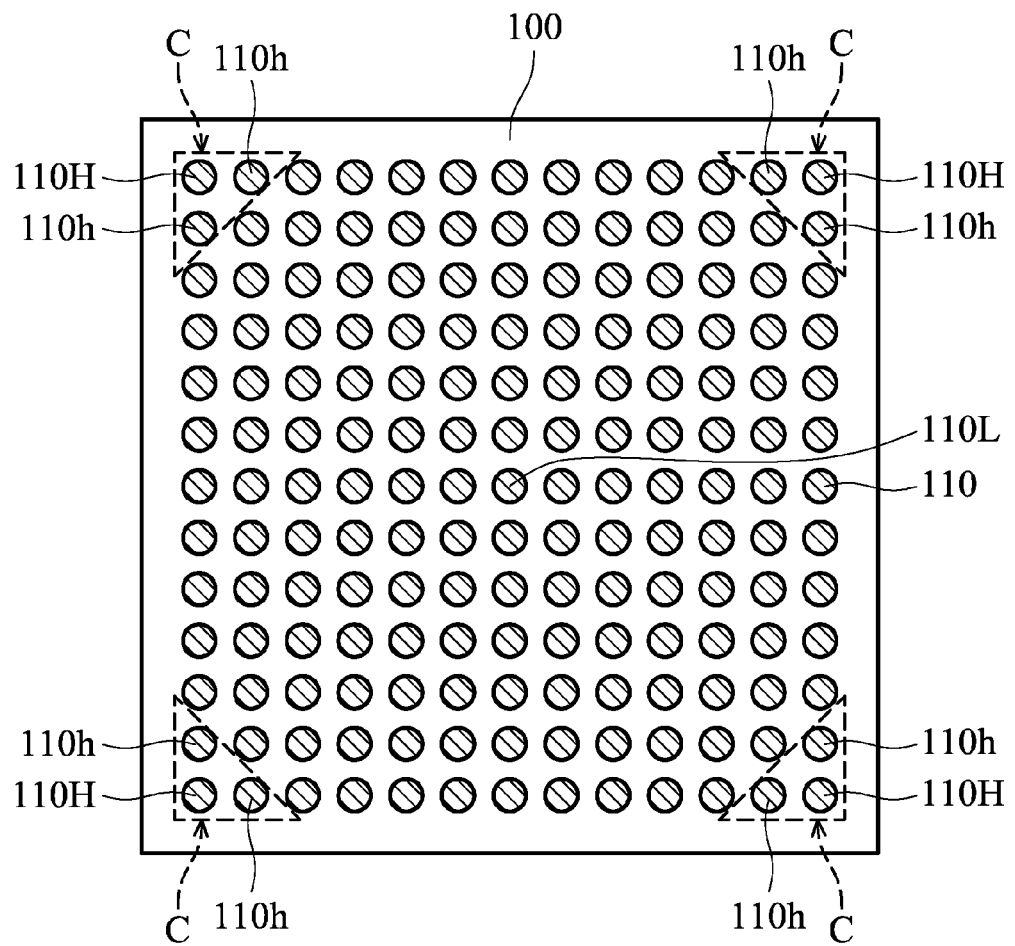
FIG. 1B is a bottom view of a cross-section of the package structure of FIG. 1A cut along a plane starting with line K-K, in accordance with some embodiments.

FIG. 1B is a bottom view of a cross-section of package structure 10 of FIG. 1A cut along a plane starting with line K-K, in accordance with some embodiments. In FIG. 1B, solder bumps 110 formed over corner regions C of semiconductor die 100 suffer from higher stress than those formed over the other regions.

For example, solder bumps 110H and 110h over corner regions C suffer from higher stress than solder bump 110L over a center region of semiconductor die 100. Furthermore, bumps 110H formed over the very corner of semiconductor die 100 may suffer from even higher stress than solder bumps 110h. Because solder bumps 110H and 110h suffer from high stress, solder bumps 110H and 110h may crack. Yield of package structure 10 would thus be reduced.

Studies show that wider solder bumps would reduce stress of bonding structures between die packages. However, the wider solder bumps occupy more surface area and reduce the space between solder bumps. Therefore, it is not desirable to replace all existing solder bumps with wider solder bumps.

Figure 2A:
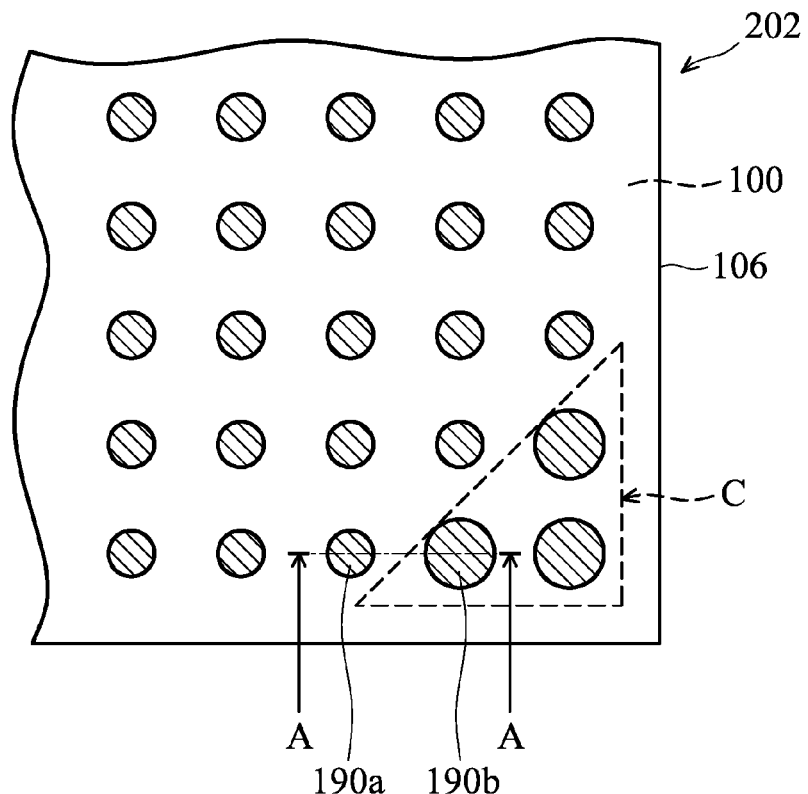
FIG. 2A is a top view of a portion of a die package, in accordance with some embodiments.
Figure 2B:
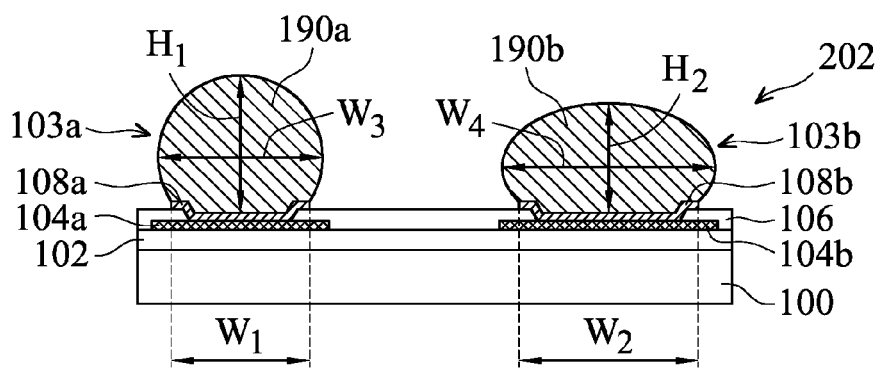
FIGS. 2B-2D are cross-sectional views of various stages of a process for forming the package structure taken along line A-A of FIG. 2A, in accordance with some embodiments.
Figure 2C:
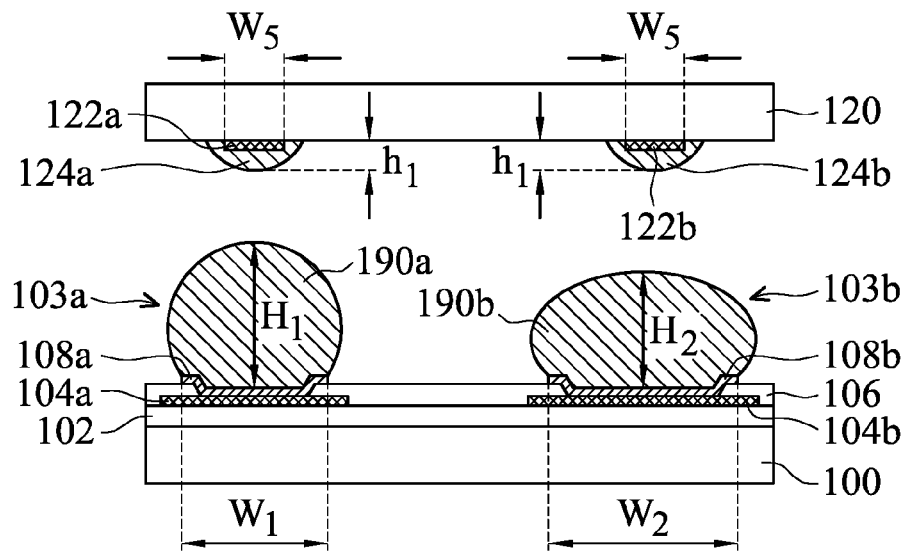
Figure 2D:
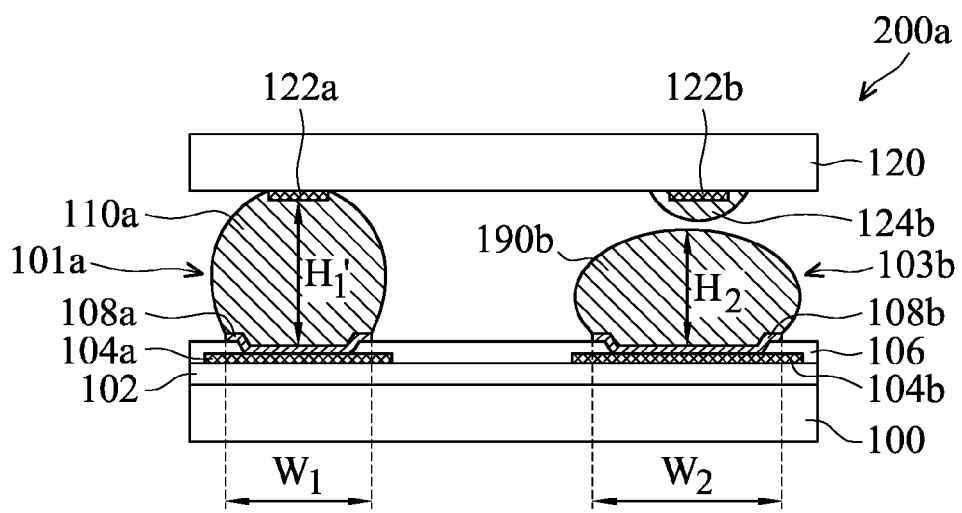

FIG. 2A is a top view of a portion of a die package, in accordance with some embodiments. FIGS. 2B-2D are cross-sectional views of various stages of a process for forming the package structure taken along line A-A of FIG. 2A. As shown in FIGS. 2A and 2B, a die package 202 including semiconductor die 100 and bump structures 103a and 103b are provided, in accordance with some embodiments.

An interconnection structure 102 is formed over semiconductor die 100. Interconnection structure 102 includes dielectric layers and metal layers. The metal layers of interconnection structure 102 provide electrical connections between the device elements formed in and/or on semiconductor die 100 and contact pads 104a and 104b. In some embodiments, contact pads 104a and 104b are portions of a post-passivation interconnect (PPI) layer formed in interconnect structure 102. Therefore, contact pads 104a and 104b are also referred to as PPI contact pads. Contact pads 104a and 104b may be made of aluminum, copper, gold, platinum, or another suitable material. The dielectric layers may include undoped silicate glass (USG), silicon nitride, silicon oxynitride, silicon oxide, another suitable material, or combinations thereof.

One or more protection layer, such as a protection layer 106, is/are deposited and patterned over interconnection structure 102 and contact pads 104a and 104b. Protection layer 106 has openings exposing contact pads 104a and 104b. In some embodiments, protection layer 106 is made of a dielectric material such as an organic material. The organic material may be made of polybenzoxazole (PBO), epoxy, polyimide, benzocyclobutene (BCB), another suitable material, or combinations thereof. Protection layer 106 may be deposited by any suitable method, such as a spin-on process, CVD process, PVD process, another suitable process, or combinations thereof.

In some embodiments, an under bump metallurgy (UBM) layer is deposited and patterned over protection layer 106 and over contact pads 104a and 104b. UBM structures, such as UBM structures 108a and 108b, are thus formed. Each of the UBM structures may include a diffusion barrier layer and a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The copper seed layer may be formed of copper or one of copper alloys that include silver, chromium, nickel, tin, gold, or combinations thereof. In some embodiments, each of the UBM structures includes a diffusion barrier layer formed of Ti and a seed layer formed of Cu.

As shown in FIGS. 2A and 2B, UBM structure 108a has a width $W_1$, and UBM structure 108b has a width $W_2$. Width $W_2$ is larger than width $W_1$. Afterwards, bumps 190a and 190b are formed over UBM structures 108a and 108b, respectively. Bump structure 103a includes bump 190a and UBM structure 108a, and bump structure 103b includes bump 190b and UBM structure 108b.

In some embodiments, bumps 190a and 190b are made of a solder material. Bumps 190a and 190b are formed by reflowing solder balls with the same volume on UBM structures 108a and 108b, in accordance with some embodiments. Bump 190b is formed over UBM structure 108b with a larger UBM surface, and bumps 190a is formed over UBM structure 108a with a smaller UBM surface by reflowing solder balls with the same volume. As a result, bump 190b would be shorter and wider than bump 190a formed over UBM structures 108a which is narrower.

Bump 190b, which is wider than bump 190a, may facilitate in reducing stress generated on solder bumps which are sequentially formed. In some embodiments, bump 190b is set to be only over a specific region, such as a high stress region (e.g. corner region C, as shown in FIG. 2A), of semiconductor die 100. The routing flexibility of the conductive lines is thus improved, compared with the die package where all existing solder bumps are replaced with wider solder bumps.

Width $W_2$ may be in a range from about 180 μm to about 260 μm. Width $W_1$ may be in a range from about 150 μm to about 230 μm. In some embodiments, a ratio ($W_2/W_1$) of width $W_2$ to width $W_1$ is in a range from about 1.04 to about 1.2. Height $H_1$ of bump 190a may be in a range from about 130 μm to about 250 μm. Height $H_2$ of bump 190b may be in a range from about 100 μm to about 240 μm. A height difference (or thickness difference) $\Delta H$ (i.e., $H_1-H_2$) may be in a range from about 10 μm to about 40 μm.

Bump 190a has a width $W_3$ which may be the maximum width of bump 190a. Width $W_3$ may be in a range from about 170 μm to about 330 μm. Bump 190b has a width $W_4$ which may be the maximum width of bump 190b. Width $W_4$ may be in a range from about 180 μm to about 360 μm. The height of the maximum width ($W_4$) of bump 190b is smaller than that of the maximum width ($W_3$) of bump 190a.

As shown in FIG. 2C, substrate 120 is provided for being bonded with semiconductor die 100 through bump structures 103a and 103b, in accordance with some embodiments. Contact pads 122a and 122b may be formed over substrate 120 and be used to be bonded with bump structures 103a and 103b, respectively. Contact pads 122a and 122b may have the same width $W_5$, in accordance with some embodiments. Solder paste structures 124a and 124b are formed over contact pads 122a and 122b, respectively. Solder paste structures 124a and 124b have the same thickness $h_1$ which may be in a range from about 40 µm to about 80 µm. A solder mask layer (not shown) may be formed next to solder paste structures 124a and 124b.

As shown in FIG. 2D, substrate 120 and semiconductor die 100 are aligned and placed against each other by using a reflowing process to form a package structure 200a, in accordance with some embodiments. After the reflowing process, solder paste structure 124a and bump 190a are reflowed to form a bonding structure 101a. Bonding structure 101a includes a solder bump 110a, UBM structure 108a, and contact pad 122a. Solder bump 110a has a height $H_1'$ which may be larger than height $H_1$. Solder bump 110a is used to provide electrical connection between contact pad 122a and contact pad 104a. However, as shown in FIG. 2D, solder paste structure 124b may not touch bump 190b since bump 190b has a smaller height ($H_2$). As a result, electrical connection is not successfully formed, which leads to device failure.

Figure 2E:
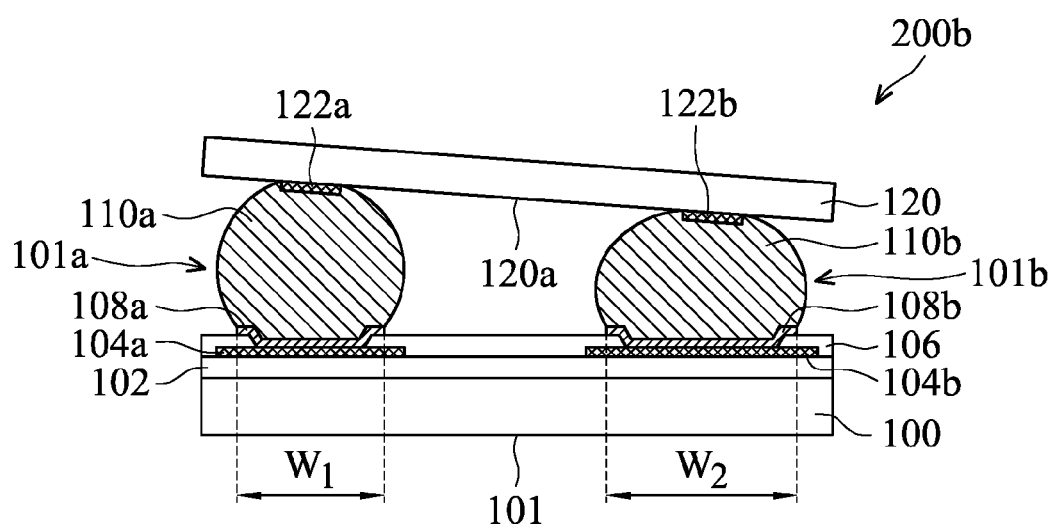
FIG. 2E is a cross-sectional view of a package structure, in accordance with some embodiments.

FIG. 2E is a cross-sectional view of a package structure 200b after substrate 120 is bonded to semiconductor die 100, in accordance with some embodiments. In package structure 200b, substrate 120 and semiconductor die 100 are forced to be bonded with each other. Substrate 120 is tilted with respect to semiconductor die 100. A portion of substrate 120 is bended downward to ensure that solder paste structure 124b and bump 190b touch with each other. After reflowing, a bonding structure 101b (including a solder bump 110b) and bonding structure 101a (including solder bump 110a) are formed. However, substrate 120, which is bent, intends to rebound such that high stress is generated in bonding structure 101b. As a result, crack risk may be increased, and the yield of package structure 200b is poor.

Figure 3A:
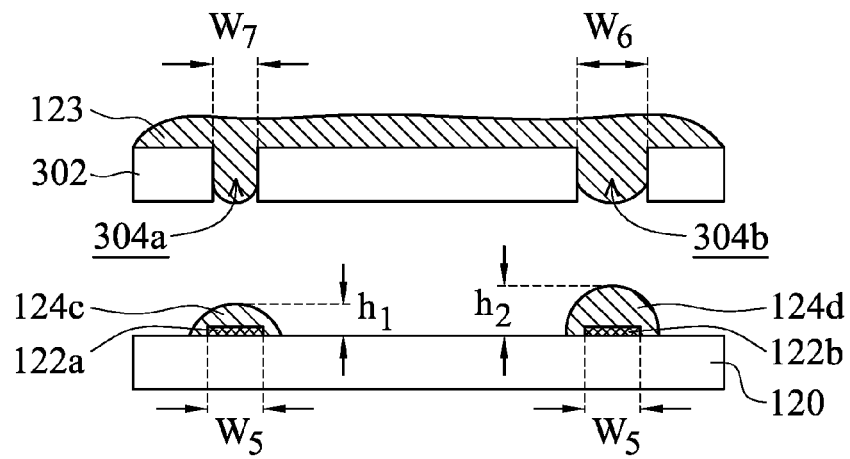
FIGS. 3A-3D are cross-sectional views of various stages of a process for forming a package structure, in accordance with some embodiments.

FIGS. 3A-3D are cross-sectional views of various stages of a process for forming a package structure, in accordance with some embodiments. As shown in FIG. 3A, solder paste structures 124c and 124d are formed over contact pads 122a and 122b on substrate 120, in accordance with some embodiments. A stencil 302 may be positioned over substrate 120 to assist in the applying of solder material 123. Stencil 302 has openings 304a and 304b. A width $W_6$ of opening 304b is larger than a width $W_7$ of opening 304a. In some embodiments, solder material 123 is applied over stencil 302. Portions of solder material 123 penetrate through openings 304a and 304b to form solder paste structures 124c and 124d on contact pads 122a and 122b, respectively. Because opening 304b is wider than opening 304a, solder paste structure 124d is thicker than solder paste structure 124c. Solder paste structure 124d has a thickness $h_2$ which may be in a range from about 50 µm to about 160 µm. A height difference (or thickness difference) $\Delta h$ (i.e. $h_2-h_1$) may be in a range from about 10 µm to about 80 µm.

Figure 3B:
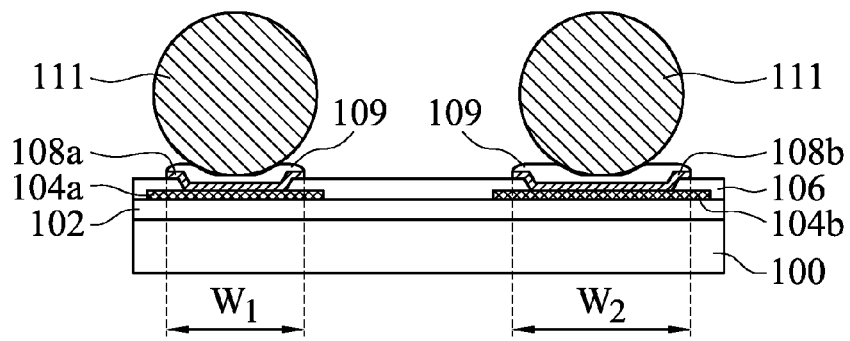

As shown in FIG. 3B, solder balls 111 are placed over UBM structures 108a and 108b formed on semiconductor die 100, in accordance with some embodiments. Before solder balls 111 are placed, a flux 109 is applied over UBM structures 108a and 108b. The volumes of solder balls 111 are substantially the same.

Figure 3C:
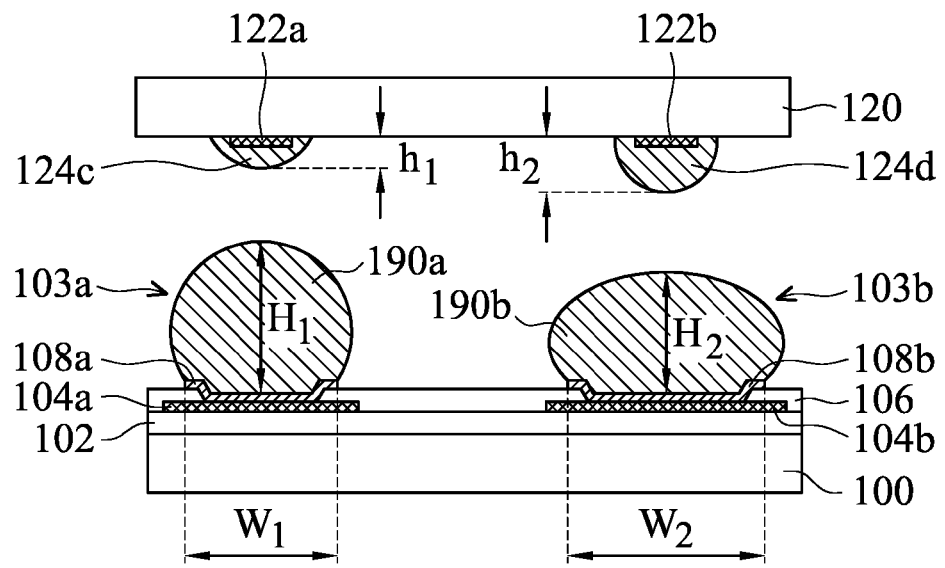

Following, as shown in FIG. 3C, a reflow operation is performed to bond solder balls 111 to UBM structures 108a and 108b to form bump structures 103a and 103b, in accordance with some embodiments. Bump structure 103a includes bump 190a and UBM structure 108a, and bump structure 103b includes bump 190b and UBM structure 108b. In some embodiments, height difference $\Delta h$ (i.e. $h_2-h_1$) and height difference $\Delta H$ (i.e., $H_1-H_2$) are substantially the same.

Bump 190b (or bump structures 103b) is shorter and wider than bump 190a (or bump structures 103a). Substrate 120 and semiconductor die 100 are aligned with each other for bonding. Solder paste structure 124d is aligned with bump 190b (or bump structure 103b) while solder paste structure 124c is aligned with bump 190a (or bump structure 103a).

Figure 3D:
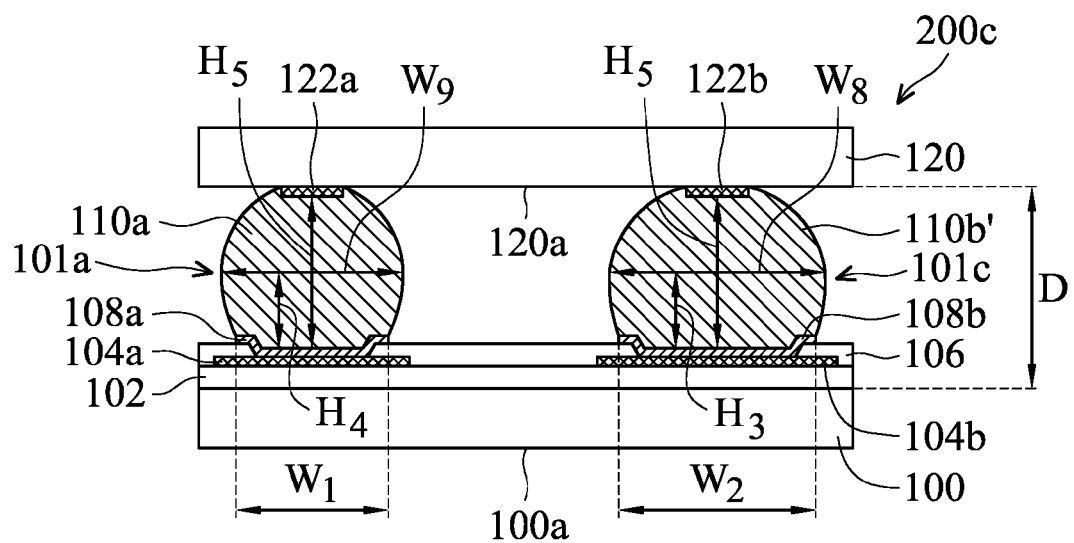

As shown in FIG. 3D, substrate 120 and semiconductor die 100 are bonded to each other by using a reflowing process, in accordance with some embodiments. Bonding structures 101a and 101c are formed between substrate 120 and semiconductor die 100, and a package structure 200c is formed. Bonding structure 101a includes a solder bump 110a, UBM structure 108a, and contact pad 122a. Bonding structure 101c includes a solder bump 110b', UBM structure 108b, and contact pad 122b.

Referring to FIGS. 3C and 3D, even though bump 190b is shorter than bump 190a, solder paste structure 124d is thicker than solder paste structure 124c. Because bump 190b is reflowed with solder paste structure 124d thicker than solder paste structure 124c, the height difference between bumps 190a and 190b is compensated. Solder paste structure 124d may not only compensate the height difference between bumps 190a and 190b, but also may provide solder bump 110b' with additional volume. As a result, after the reflowing process, solder bumps 110a and 110b' formed between substrate 120 and semiconductor die 100 have substantially the same heights $H_5$. Solder bump 110b' has a volume larger than that of solder bump 110a.

As shown in FIG. 3D, a surface 120a of substrate 120 is thus substantially parallel to a surface 100a of semiconductor die 100. A distance D between substrate 120 and semiconductor die 100 remains substantially the same. Solder bumps 110a and 110b' may have desired shapes and configurations. Crack risk is significantly reduced. The yield of package structure 200c is improved.

As shown in FIG. 3D, solder bump 110a has a width $W_9$ which may be the maximum width of solder bump 110a. Width $W_9$ may be in a range from about 180 µm to about 390 µm. A height $H_4$ at width $W_9$ may be in a range from about 50 µm to about 100 µm. A ratio ($H_4/H_5$) of height $H_4$ to height $H_5$ is in a range from about 0.4 to about 0.6. For example, height $H_4$ is about half of height $H_5$.

As shown in FIG. 3D, solder bump 110b' has a width $W_8$ which may be the maximum width of solder bump 110b'. Width $W_8$ may be in a range from about 190 µm to about 410 µm. A height $H_3$ at width $W_8$ may be in a range from about 30 µm to about 90 µm. A ratio ($H_3/H_5$) of height $H_3$ to height $H_5$ is in a range from about 0.2 to about 0.5. For example, height $H_3$ is about half of height $H_5$. In some embodiments, the maximum width ($W_9$) of solder bump 110a and the maximum width ($W_8$) are at substantially the same height. The widest portion of solder bump 110a may be laterally aligned with the widest portion of solder bump 110b'.

Figure 4A:
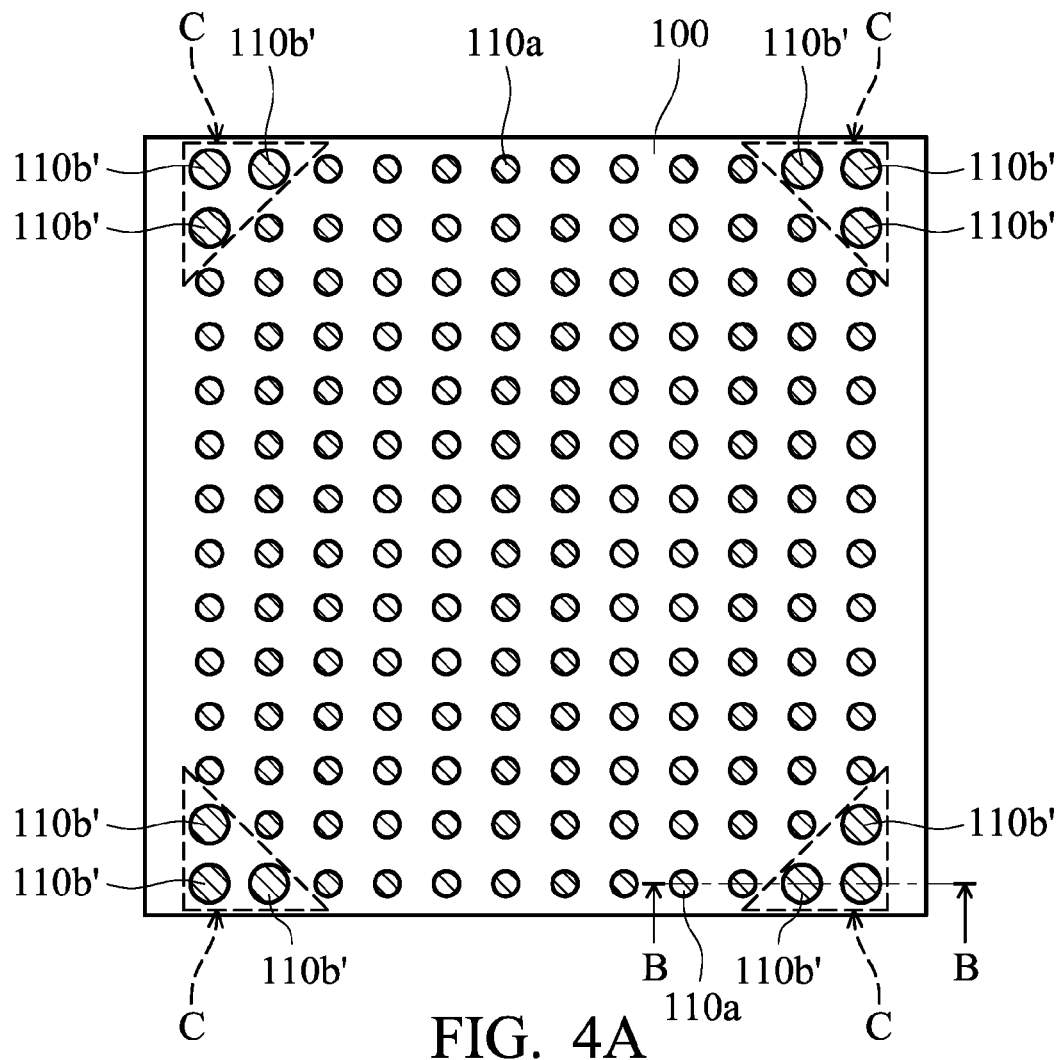
FIG. 4A is a bottom view of a cross-section of solder bumps distributed on a semiconductor die of a package structure, in accordance with some embodiments.
Figure 4B:
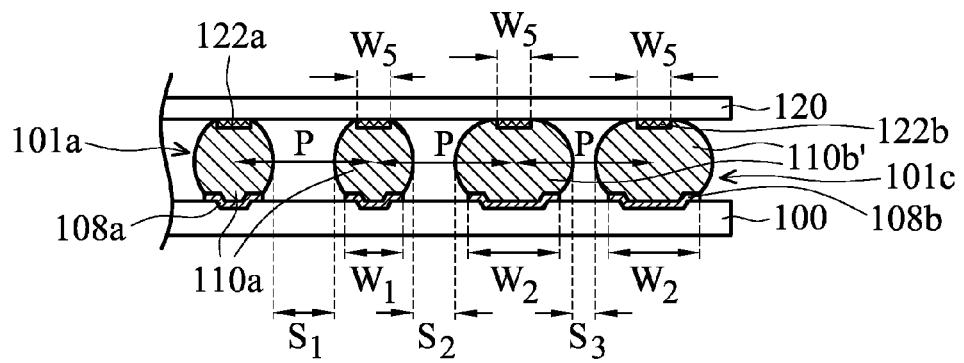
FIG. 4B is a cross-sectional view of a package structure taken along line B-B of FIG. 4A, in accordance with some embodiments.

FIG. 4A is a bottom view of a cross-section of solder bumps distributed on a semiconductor die of a package structure, in accordance with some embodiments. FIG. 4B is a cross-sectional view of a package structure taken along line B-B of FIG. 4A, in accordance with some embodiments.

As shown in FIGS. 4A and 4B, bonding structures 101a and 101c are formed over a semiconductor die 100. Bonding structure 101a includes a solder bump 110a, UBM structure 108a and contact pad 122a. Bonding structure 101c includes a solder bump 110b', UBM structure 108b and contact pad 122b. As mentioned above, solder bumps 110b', which are wider, could reduce stress. In some embodiments, solder bumps 110b' are formed over high stress regions (such as corner regions C) of semiconductor die 100. Solder bumps 110a are formed over low stress regions which suffer from lower stress, compared to that of the high stress region.

Solder bumps 110b', which are formed over corner region C of semiconductor die 100, are wider than solder bumps 110a. Each of solder bumps 110b' has a top surface with a width $W_2$, which may be equal to the width of an UBM structure 108b formed over solder bump 110b'. Width $W_2$ is larger than a width $W_1$ of a top surface of solder bump 110a. Each of solder bumps 110b' and 110a has a lower surface with a width, which may be equal to width $W_5$ of contact pads 122a and 122b formed over substrate 120.

Pitches P between solder bumps 110a and 110b' are the same, in accordance with some embodiments. Space $S_1$ between solder bumps 110a is larger than space $S_2$ between solder bumps 110a and 110b', and space $S_2$ is larger than space $S_3$ between solder bumps 110b', in accordance with some embodiments.

Figure 5A:
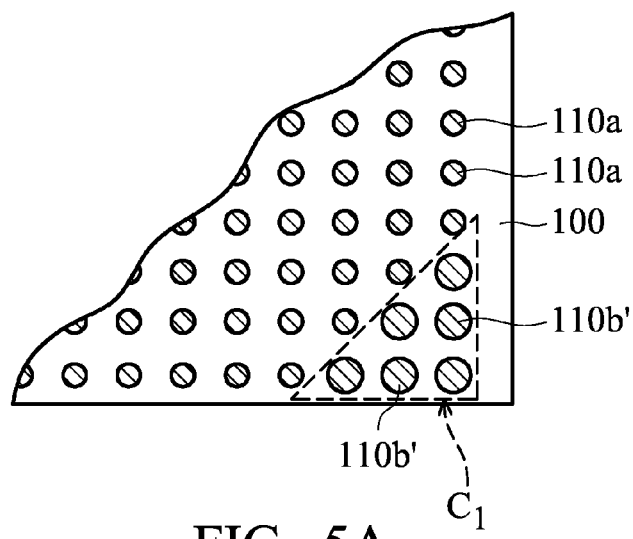
FIG. 5A is a bottom view of a cross-section of solder bumps distributed on a semiconductor die of a package structure, in accordance with some embodiments.

FIG. 5A is a bottom view of a cross-section of solder bumps distributed on a semiconductor die of a package structure, in accordance with some embodiments. The number of solder bumps 110b' over the each of high stress regions of semiconductor die 100 (such as corner region $C_1$) are not limited to be three. For example, there are six solder bumps 110b' over corner region $C_1$. That is, the number and the arrangement of solder bumps 110b' may be tuned, depending on the distribution of the stress.

Figure 5B:
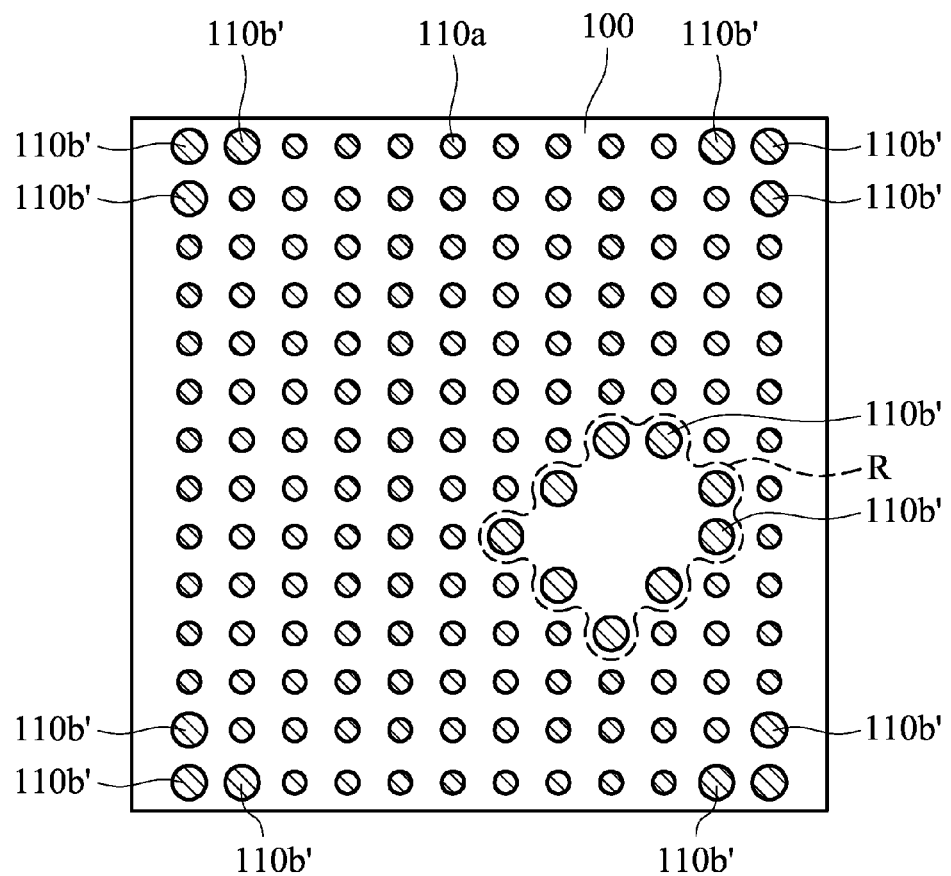
FIG. 5B is a bottom view of a cross-section of solder bumps distributed on a semiconductor die of a package structure, in accordance with some embodiments.

FIG. 5B is a bottom view of a cross-section of solder bumps distributed on a semiconductor die of a package structure, in accordance with some embodiments. Solder bumps 110b' are not limited to be formed over corner regions of semiconductor die 100. For example, a region R of semiconductor die 100 may suffer from a high stress. In this case, solder bumps 110b' may also be formed over region R to increase the reliability of the package structure.

Embodiments of mechanisms for forming a package structure described above provide wider bonding structures near edges of the package structure to reduce bonding stress. The wider bonding structures may be also placed in other locations with high bonding stress. By using the wider bonding structures to reduce stress, the cracking risk of bonding structures is greatly reduced.

In accordance with some embodiments, a method for forming a package structure is provided. The method includes providing a semiconductor die and forming a first bump structure and a second bump structure over the semiconductor die. The second bump structure is thinner and wider than the first bump structure. The method also includes providing a substrate having a first contact pad and a second contact pad formed on the substrate. The method further includes forming a first solder paste structure and a second solder paste structure over the first contact pad and the second contact pad, respectively. The second solder paste structure is thicker than the first solder paste structure. In addition, the method includes reflowing the first bump structure and the second bump structure with the first solder paste structure and the second solder paste structure, respectively, to bond the semiconductor die to the substrate.

In accordance with some embodiments, a package structure is provided. The package structure includes a semiconductor die. The package structure also includes a substrate bonded to the semiconductor die through a first bonding structure and a second bonding structure between the semiconductor die and the substrate. The first bonding structure and the second bonding structure are next to each other, and the second bonding structure is wider than the first bonding structure.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a package structure, comprising:
providing a semiconductor die;
forming a first bump structure and a second bump structure over the semiconductor die, wherein the second bump structure is thinner and wider than the first bump structure;
providing a substrate having a first contact pad and a second contact pad formed thereon;
forming a first solder paste structure and a second solder paste structure over the first contact pad and the second contact pad, respectively, wherein the second solder paste structure is thicker than the first solder paste structure; and
reflowing the first bump structure and the second bump structure with the first solder paste structure and the second solder paste structure, respectively, to bond the semiconductor die to the substrate.

2. The method for forming a package structure as claimed in claim 1, wherein the step of forming the first bump structure and the second bump structure comprises:
forming a first under bump metallurgy (UBM) structure and a second UBM structure over the semiconductor die, wherein the second UBM structure is wider than the first UBM structure; and
forming a first bump and a second bump over the first UBM structure and the second UBM structure, respectively, wherein the second bump is thinner and wider than the first bump.

3. The method for forming a package structure as claimed in claim 2, wherein volumes of the first bump and the second bump are substantially the same.

4. The method for forming a package structure as claimed in claim 2, wherein a thickness difference between the first bump and the second bump is substantially equal to a thickness difference between the second solder paste structure and the first solder paste structure.

5. The method for forming a package structure as claimed in claim 2, wherein the step of forming the first bump and the second bump comprises:
placing a first solder ball and a second solder ball over the first UBM structure and the second UBM structure, respectively; and
reflowing the first solder ball and the second ball to form the first bump and the second bump, respectively.

6. The method for forming a package structure as claimed in claim 5, wherein shapes and sizes of the first solder ball and the second solder ball are substantially the same.

7. The method for forming a package structure as claimed in claim 2, the first UBM structure and the second UBM structure are simultaneously formed.

8. The method for forming a package structure as claimed in claim 1, wherein the second bump structure is formed over a high stress region of the semiconductor die.

9. The method for forming a package structure as claimed in claim 8, wherein the second bump structure is formed over a corner region of the semiconductor die.

10. The method for forming a package structure as claimed in claim 1, wherein the step of forming the first solder paste structure and the second solder paste structure comprises:
   positioning a stencil over the substrate, wherein the stencil has a first opening and a second opening exposing the first contact pad and the second contact pad, respectively, wherein the second opening is larger than the first opening; and
   applying a solder material over the stencil such that portions of the solder material penetrate through the first opening and the second opening to form the first solder paste structure and the second solder paste structure.

11. The method for forming a package structure as claimed in claim 1, wherein the first solder paste structure and the second solder paste structure are simultaneously formed.

12. The method for forming a package structure as claimed in claim 1, wherein a volume of the second paste structure is larger than a volume of the first paste structure.

13. The method for forming a package structure as claimed in claim 1, wherein a surface of the substrate is substantially parallel to a surface of the semiconductor die after bonding the semiconductor die to the substrate.

14. A method for forming a package structure, comprising:
   providing a semiconductor die;
   forming a first bump structure and a second bump structure over the semiconductor die, wherein the second bump structure is thinner and wider than the first bump structure;
   providing a substrate;
   forming a first solder paste structure and a second solder paste structure over substrate, wherein the second solder paste structure is thicker than the first solder paste structure; and
   reflowing the first bump structure and the second bump structure with the first solder paste structure and the second solder paste structure, respectively, to bond the semiconductor die to the substrate.

15. The method for forming a package structure as claimed in claim 14, wherein the step of forming the first bump structure and the second bump structure comprises:
   forming a first under bump metallurgy (UBM) structure and a second UBM structure over the semiconductor die, wherein the second UBM structure is wider than the first UBM structure; and forming a first bump and a second bump over the first UBM structure and the second UBM structure, respectively, wherein the second bump is thinner and wider than the first bump.

16. The method for forming a package structure as claimed in claim 15, wherein volumes of the first bump and the second bump are substantially the same.

17. The method for forming a package structure as claimed in claim 15, wherein a thickness difference between the first bump and the second bump is substantially equal to a thickness difference between the second solder paste structure and the first solder paste structure.

18. The method for forming a package structure as claimed in claim 14, wherein the step of forming the first solder paste structure and the second solder paste structure comprises:
   positioning a stencil over the substrate, wherein the stencil has a first opening and a second opening, and the second opening is larger than the first opening; and
   applying a solder material over the stencil such that portions of the solder material penetrate through the first opening and the second opening to form the first solder paste structure and the second solder paste structure.

19. A method for forming a package structure, comprising:
   providing a semiconductor die;
   forming a first bump structure and a second bump structure over the semiconductor die, wherein the second bump structure is thinner and wider than the first bump structure;
   providing a substrate;
   forming a first solder paste structure and a second solder paste structure over substrate, wherein the second solder paste structure is thicker than the first solder paste structure; and
   connecting the first bump structure and the second bump structure with the first solder paste structure and the second solder paste structure, respectively, to bond the semiconductor die to the substrate.

20. The method for forming a package structure as claimed in claim 19, wherein a thickness difference between first bump structure and the second bump structure is substantially equal to a thickness difference between the second solder paste structure and the first solder paste structure.

* * * * *